US012672254B2

(12) United States Patent
Annenkov

(10) Patent No.: US 12,672,254 B2
(45) Date of Patent: Jun. 30, 2026

(54) METHODS AND SYSTEMS FOR COOLING AN ELECTRONIC COMPONENT OF A SPEAKER DEVICE

(71) Applicant: Direct Cursus Technology L.L.C, Dubai (AE)

(72) Inventor: Grigory Annenkov, Moscow (RU)

(73) Assignee: Y.E. Hub Armenia LLC, Yerevan (AM)

( * ) Notice: Subject to any disclaimer, the term of this patent is extended or adjusted under 35 U.S.C. 154(b) by 239 days.

(21) Appl. No.: 18/384,043

(22) Filed: Oct. 26, 2023

(65) Prior Publication Data

US 2024/0164046 A1 May 16, 2024

(30) Foreign Application Priority Data

Nov. 10, 2022 (RU) ............................ RU2022129237

(51) Int. Cl.
*H05K 7/20* (2006.01)
*H04R 1/02* (2006.01)

(52) U.S. Cl.
CPC ......... *H05K 7/20127* (2013.01); *H04R 1/028* (2013.01)

(58) Field of Classification Search
CPC ............................ H05K 7/20127; H04R 1/028
See application file for complete search history.

(56) References Cited

U.S. PATENT DOCUMENTS

| | | | |
|---|---|---|---|
| 6,259,798 B1 * | 7/2001 | Perkins | ................... H04R 1/02 |
| | | | 381/397 |
| 9,992,562 B1 | 6/2018 | Keong | |
| 10,104,761 B1 | 10/2018 | Macdonald et al. | |
| 10,317,960 B2 | 6/2019 | Wong et al. | |
| 11,212,940 B1 | 12/2021 | Rahim et al. | |
| 2011/0240260 A1 | 10/2011 | Van Der Tempel | |

(Continued)

FOREIGN PATENT DOCUMENTS

| | | |
|---|---|---|
| CN | 104420936 A | 3/2015 |
| CN | 207783398 U | 8/2018 |

(Continued)

OTHER PUBLICATIONS

Search report issued on Dec. 2, 2024 by the Taiwan Intellectual Property Office in respect of the counterpart Taiwan patent application No. 112142757.

(Continued)

*Primary Examiner* — Andrew Sniezek
(74) *Attorney, Agent, or Firm* — BCF LLP

(57) ABSTRACT

Methods and systems for cooling an electronic component of a speaker device, the speaker device comprising an acoustic component generating acoustic waves and an electronic component generating thermal energy. The system is a passive heat removal component including a body configured to be removably attached to the speaker device, the body defining a valvular conduit having a first end and a second end, the valvular conduit allowing an airflow in a pre-determined direction through the body from the first end to the second end. The body is disposed in proximity to an electronic component of the speaker device for transferring thermal energy from the electronic component to the airflow in the valvular conduit.

17 Claims, 7 Drawing Sheets

(56) References Cited

U.S. PATENT DOCUMENTS

| | | |
|---|---|---|
| 2014/0049939 A1 | 2/2014 | Kuenzler et al. |
| 2014/0092544 A1 | 4/2014 | Nishi et al. |
| 2016/0360644 A1 | 12/2016 | Bains |
| 2017/0205858 A1 | 7/2017 | Wong et al. |
| 2020/0033919 A1 | 1/2020 | Dan et al. |
| 2020/0112792 A1* | 4/2020 | Ramones ................. H04R 9/06 |
| 2023/0164955 A1* | 5/2023 | Chuang .................... F28F 3/06 |
| | | 165/185 |

FOREIGN PATENT DOCUMENTS

| | | | |
|---|---|---|---|
| CN | 110856055 | A | 2/2020 |
| CN | 213150765 | U | 5/2021 |
| CN | 115151075 | A | 10/2022 |
| CN | 217741864 | U | 11/2022 |
| RU | 2519588 | C1 | 6/2014 |
| TW | 201721078 | A | 6/2017 |
| TW | I778875 | B | 9/2022 |

OTHER PUBLICATIONS

Russian Search Report dated Oct. 19, 2023 issued in respect of the counterpart Russian Patent Application No. RU 2022129237.
Search report issued on Oct. 3, 2025 by the Taiwan Intellectual Property Office in respect of the counterpart Taiwan patent application No. 112142757.

* cited by examiner

START

Passively intake, by a valvular conduit defined in a body, air from environment — 705

Heat, by the body, the air in the valvular conduit — 710

Passively exhaust, by the valvular conduit, heated air towards an acoustic component — 715

Move, by an acoustic component, the heater air away from the speaker device using acoustic waves generated by the acoustic component — 720

END

700

METHODS AND SYSTEMS FOR COOLING AN ELECTRONIC COMPONENT OF A SPEAKER DEVICE

CROSS-REFERENCE

The present application claims priority to Russian Patent Application No. 2022129237, entitled "Methods and Systems for Cooling an Electronic Component of A Speaker Device", filed Nov. 10, 2022, the entirety of which is incorporated herein by reference.

FIELD OF TECHNOLOGY

The present technology relates to methods and systems for cooling electronic components, and more specifically, to cooling an electronic component of a speaker device.

BACKGROUND

There are many electronic devices that are capable of processing and outputting audio (i.e. audio devices). These devices include: smart-phones, tablets, audio players, and the like. These electronic devices can have transducers such as speakers and microphones. A microphone is usually configured to pick up an audio input for the device and the speaker is usually configured to reproduce an audio output by the device. An audio output may be representative of a song or other types of audio recordings while an audio input may be representative of ambient sounds and/or spoken utterances, such as words spoken by an operator of the electronic device, that occur in proximity of the microphone.

In use, the electronic component generates a significant amount of heat that must be dissipated in order to ensure continued efficient operation of the electronic device. Many cooling solutions have been implemented to address this problem, including using fans. However, those solutions are usually active components that require electric power to operate and/or generate undesirable noise that may alter the overall sound generated by the microphone.

SUMMARY

One object of the present technology is to ameliorate at least some of the inconveniences of the prior art. More specifically, it is an object of the present technology to provide a device to cool electronic component of a speaker device that can alleviate at least some of the drawbacks of the prior art.

The developers of the present technology have developed a passive heat removal component and a method for cooling an electronic component of a speaker device.

In a first broad aspect of the present technology, there is provided a passive heat removal component for a speaker device. The passive heat removal component has a body configured for to be removably attached to the speaker device. The body defines a valvular conduit having a first end and a second end, the valvular conduit being configured to enable an airflow in a pre-determined direction through the body from the first end to the second end. The body is disposed in proximity to an electronic component of the speaker device for transferring thermal energy from the electronic component to the airflow in the valvular conduit.

In some embodiments of the passive heat removal component, the second end of the valvular conduit is disposed in proximity to an acoustic component of the speaker device, such that operation of the acoustic component is configured to cause movement of heated airflow away from the speaker device by the acoustic waves.

In some embodiments of the passive heat removal component, the valvular conduit vertically extends in the body such that the first end is located on a bottom portion of the body and the second end is located on a top portion of the body.

In some embodiments of the passive heat removal component, the valvular conduit is a channel-like valvular conduit defined on a surface of the body.

In some embodiments of the passive heat removal component, the valvular conduit is a chamber-like valvular conduit defined in the body.

In some embodiments of the passive heat removal component, the valvular conduit includes at least one of an enlargement, recess, projection, baffle, and a bucket or a combination thereof for at least one of (i) reducing resistance to the airflow in the pre-determined direction and (ii) increasing resistance to the airflow in a direction opposite to the pre-determined direction.

In some embodiments of the passive heat removal component, the valvular conduit is a tesla-valve conduit.

In some embodiments of the passive heat removal component, the body defines a plurality of valvular conduits, the valvular conduit being one of the plurality of valvular conduits, an other one from the plurality of valvular conduits extending parallel to the valvular conduit in the body.

In some embodiments of the passive heat removal component, the first end is disposed in proximity to the electronic component.

In some embodiments of the passive heat removal component, at least a portion of the body is maintained in thermal contact with the electronic component.

In some embodiments of the passive heat removal component, the acoustic component is a speaker.

In some embodiments of the passive heat removal component, the electronic component is located on a motherboard.

In some embodiments of the passive heat removal component, the electronic component comprises at least one of a processor, and a memory component.

In some embodiments of the passive heat removal component, the body is made of a material selected from a group of materials, said group comprising: aluminum, zinc, and copper.

In a second broad aspect of the present technology, there is provided a method of cooling an electronic component of a speaker device, the speaker device comprising the electronic component, an acoustic component, and a heat removal component, the heat removal component having a body removably attached to the speaker device. The method comprises passively intaking, by a valvular conduit defined in the body, air from environment, the valvular conduit being configured to enable airflow in a pre-determined direction through the body, heating, by the body, the air in the valvular conduit, passively exhausting, by the valvular conduit, heated air towards the acoustic component and moving, by the acoustic component, the heated air away from the speaker device using acoustic waves generated by the acoustic component.

In some embodiments of the method, the speaker device has a wall with an aperture. The method comprises guiding, by the aperture, the air from the environment towards the valvular conduit.

In some embodiments of the method, the method further comprises passively intaking, by an other valvular conduit defined in the body, other air from the environment, the other valvular conduit being configured to enable airflow in the pre-determined direction through the body, heating, by the body, the other air in the other valvular conduit, passively exhausting, by the other valvular conduit, other heated air towards the acoustic component and moving, by the acoustic component, the other heated air away from the speaker device using the acoustic waves.

In a third broad aspect of the present technology, there is provided a speaker device comprising an acoustic component generating acoustic waves, an electronic component generating thermal energy and a passive heat removal component including a body removably attached to the speaker device. The body defines a valvular conduit having a first end and a second end, the valvular conduit being configured to enable an airflow in a pre-determined direction through the body from the first end to the second end. The body is disposed in proximity to the electronic component for transferring thermal energy from the electronic component to the airflow in the valvular conduit.

In some embodiments of the speaker device, the second end of the valvular conduit is disposed in proximity to the acoustic component, such that operation of the acoustic component is configured to cause movement of heated airflow away from the speaker device by the acoustic waves.

In some embodiments of the speaker device, the valvular conduit vertically extends in the body such that the first end is located on a bottom portion of the body and the second end is located on a top portion of the body.

In some embodiments of the speaker device, the valvular conduit is a channel-like valvular conduit defined on a surface of the body.

In some embodiments of the speaker device, the valvular conduit is a chamber-like valvular conduit defined in the body.

In some embodiments of the speaker device, the valvular conduit includes at least one of an enlargement, recess, projection, baffle, and a bucket or a combination thereof for at least one of (i) reducing resistance to the airflow in the pre-determined direction and (ii) increasing resistance to the airflow in a direction opposite to the pre-determined direction.

In some embodiments of the speaker device, the valvular conduit is a tesla-valve conduit.

In some embodiments of the speaker device, the body defines a plurality of valvular conduits, the valvular conduit being one of the plurality of valvular conduits, an other one from the plurality of valvular conduits extending parallel to the valvular conduit in the body.

In some embodiments of the speaker device, the first end is disposed in proximity to the electronic component.

In some embodiments of the speaker device, at least a portion of the body is maintained in thermal contact with the electronic component.

In some embodiments of the speaker device, the acoustic component is a speaker.

In some embodiments of the speaker device, the electronic component is located on a motherboard.

In some embodiments of the speaker device, the electronic component comprises at least one of a processor, and a memory component.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

Additional and/or alternative features, aspects and advantages of implementations of the present technology will become apparent from the following description, the accompanying drawings and the appended claims.

BRIEF DESCRIPTION OF THE DRAWINGS

These and other features, aspects and advantages of the present technology will become better understood with regard to the following description, appended claims and accompanying drawings where:

DETAILED DESCRIPTION

Figure 1:
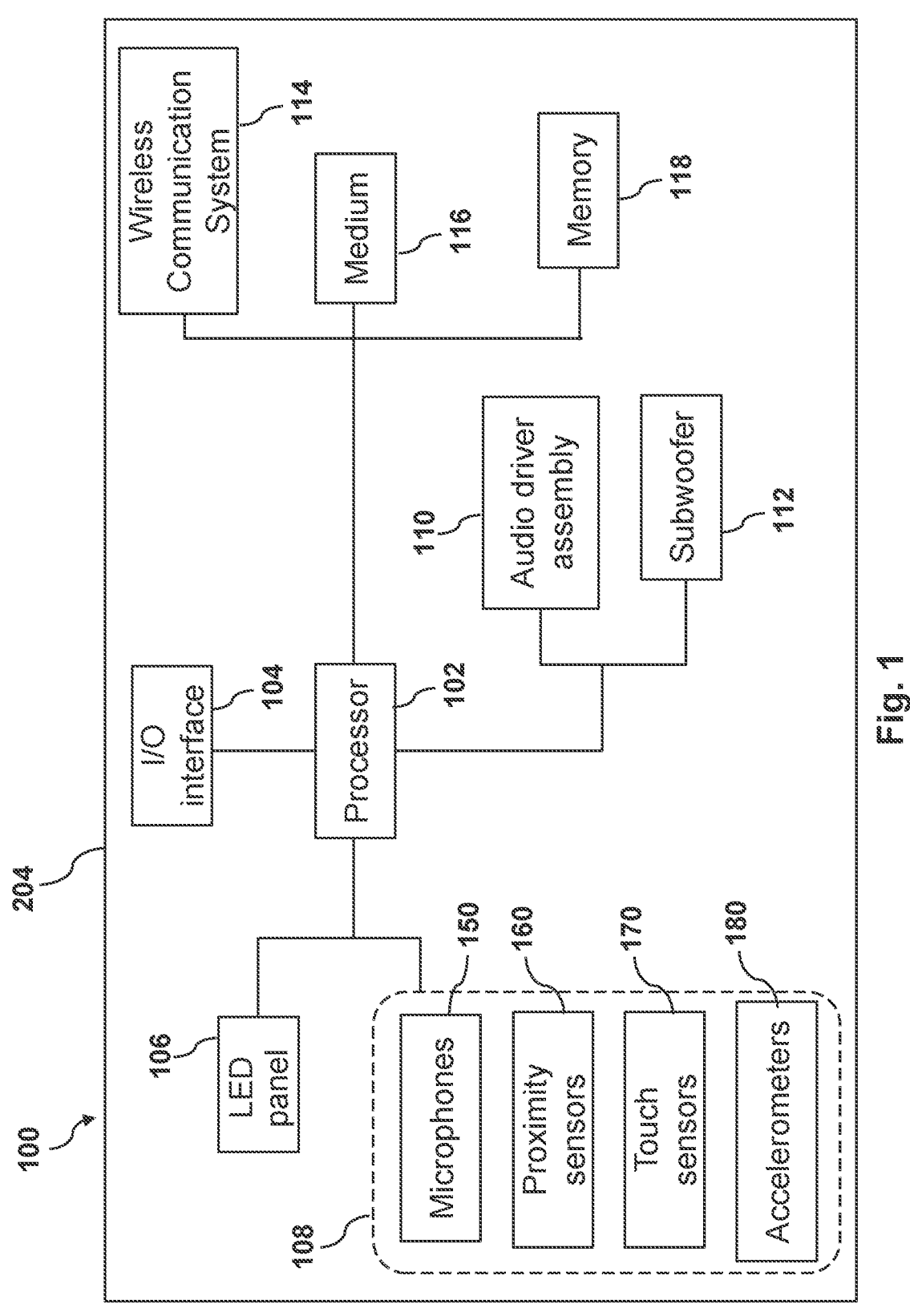
FIG. 1 depicts a schematic block diagram of an electronic device that may be implemented as a speaker device in accordance with some embodiments of the present technology.

Various representative implementations of the disclosed technology will be described more fully hereinafter with reference to the accompanying drawings. The present technology may, however, be implemented in many different forms and should not be construed as limited to the representative implementations set forth herein. In the drawings, the sizes and relative sizes of layers and regions may be exaggerated for clarity. Like numerals refer to like elements throughout.

The examples and conditional language recited herein are principally intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

It will be understood that, although the terms first, second, third, etc. may be used herein to describe various elements, these elements should not be limited by these terms. These terms are used to distinguish one element from another. Thus, a first element discussed below could be termed a second element without departing from the teachings of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. By contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is only intended to describe particular representative implementations and is not intended to be limiting of the present technology. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The functions of the various elements shown in the figures, including any functional block labeled as a "processor," may be provided through the use of dedicated hardware as well as hardware capable of executing software. When provided by a processor, the functions may be provided by a single dedicated processor, by a single shared processor, or by a plurality of individual processors, some of which may be shared. In some implementations of the present technology, the processor may be a general-purpose processor, such as a central processing unit (CPU) or a processor dedicated to a specific purpose, such as a digital signal processor (DSP). Moreover, explicit use of the term a "processor" should not be construed to refer exclusively to hardware capable of executing software, and may implicitly include, without limitation, an application-specific integrated circuit (ASIC), a field-programmable gate array (FPGA), a read-only memory (ROM) for storing software, a random-access memory (RAM), and non-volatile storage. Other hardware, conventional and/or custom, may also be included.

Software modules, or simply modules or units which are implied to be software, may be represented herein as any combination of flowchart elements or other elements indicating the performance of process steps and/or textual description. Such modules may be executed by hardware that is expressly or implicitly shown. Moreover, it should be understood that a module may include, for example, but without limitation, computer program logic, computer program instructions, software, stack, firmware, hardware circuitry, or a combination thereof, which provides the required capabilities.

It will be understood that computer-readable program instructions can be downloaded to respective computing or processing devices from a computer-readable storage medium or to an external computer or external storage device via a network, for example, the Internet, a local area network, a wide area network and/or a wireless network. A network interface in a computing/processing device may receive computer-readable program instructions via the network and forward the computer-readable program instructions for storage in a computer-readable storage medium within the respective computing or processing device.

With these fundamentals in place, we will now consider some non-limiting examples to illustrate various implementations of aspects of the present disclosure.

Electronic Device

With reference to FIG. 1, there is depicted a block diagram illustrating communication and interoperability between various electrical components of an electronic device 100. In some embodiments of the present technology, the electronic device 100 can be implemented as a smart speaker.

Broadly speaking, a smart speaker is a type of loudspeaker and voice command device with an integrated virtual assistant, also known as an "intelligent personal assistant", and which can offer interactive actions and hands-free activation with the help of uttered commands. Some smart speakers can be communicatively coupled via Wi-Fi, Bluetooth and/or other protocol standards to extend usage of the smart speaker beyond audio playback. In some implementations, a smart speaker can be configured to be compatible across a number of services and platforms, peer-to-peer connection through mesh networking, virtual assistants, to control home automation devices, for example.

In the illustrated embodiment, the electronic device 100 comprises a processor 102. The processor 102 can be in communication with the depicted electrical components. User interface 104 can receive user inputs that are then received by processor 102. In response to the user inputs, processor 102 can interpret and relay signals corresponding to the received user inputs to other electrical components. For example, user interface can receive user inputs directing an increase in output of both subwoofer 112 and audio driver assemblies 110. In some embodiments, the electrical components can all be linked together by electrically conductive pathways established by known components, which is able to route electrical signals to various electrical components distributed throughout a device housing of the electronic device 100.

In the illustrated embodiment, the electronic device 100 comprises a Light-Emitting Diode (LED) panel 106. The LED panel 106 may be configured to provide visual feedback to a user of the electronic device 100. For example, the visual feedback can be provided in response to interaction with a voice assistant such as the Siri®, Alisa®, and/or Alexa®. In some embodiments, an array of colorful mosaic patterns could be presented while a voice request is being processed and/or as the voice assistant is waiting for the voice request.

In the illustrated embodiment, the electronic device 100 comprises a computer-readable medium 116. The computer-readable medium 116 can be configured to store or at least cache an amount of media files for playback by the subwoofer 112 and the audio driver assemblies 110. In some embodiments, the media files stored on the computer-readable medium 116 can include, e.g., movies, TV shows, pictures, audio recordings and music videos. In some embodiments, a video portion of a media file can be transmitted to another device for display via a wireless communication system 114. This could be desirable even when LED panel 106 is showing the video portion since another device may have a larger or more easily viewable display for a particular user. For example, the other display device could be selected in accordance with a user's position within a room, without departing from the scope of the present technology.

In the illustrated embodiment, the electronic device 100 comprises a memory component 118. The memory component 118 can include Random Access Memory (RAM) for short term caching of frequently used information and/or information cued just prior to playback. The memory component 118 can include Read Only Memory (ROM) to store computer code such as device drivers and lower level code used in the basic operation of the electronic device 100. In some embodiments, the memory component 118 may more than one separate components.

In the illustrated embodiment, the electronic device 100 comprises a plurality of sensors 108. The plurality of sensors 108 can include one or more microphones 150, one or more proximity sensors 160, one or more touch sensors 170, one or more accelerometers 180 and/or the like. The one or more microphones 150 may be configured to monitor for voice commands. In some embodiments, the one or more microphones 150 could be configured to process voice commands only after recognizing a command phrase indicating the user's intent to issue a voice command. For example, the one or more microphones 150 can be interspersed radially along the outside of the device housing so that the housing does not mask or obscure the voice commands. Multiple microphones may also be utilized to triangulate a position of a user within the room, without departing from the scope of the present technology.

The one or more proximity sensors 160 can be distributed along the exterior surface of electronic device 100 in order to help identify the presence of users and/or obstructions surrounding electronic device 100. In some embodiments, the one or more proximity sensors 160 can be configured to emit infrared pulses that help characterize object(s) surrounding the electronic device 100. The pulses reflected back to the one or more proximity sensors 160 can be processed by processor 102, which can then make a characterization of object(s) surrounding the electronic device 100. In some embodiments, an audio output of the electronic device 100 can be adjusted based on surrounding object(s). For example, if the electronic device 100 is positioned against a wall or column the infrared sensors could identify the obstruction and attenuate or cease output of speaker drivers pointed toward the wall or column. The reflected pulses and audio triangulation data can be combined to further refine the position of a user delivering instructions to the electronic device 100.

The plurality of sensors 108 includes the one or more touch sensors 170 that allow a user to input commands along an exterior surface of electronic device 100. plurality of sensors 108 includes the one or more accelerometers 180 that may be configured to measure any tilt of electronic device 100 with respect to a gravitational reference frame. For example, when placing the electronic device 100 on an inclined or declined surface could negatively impact the acoustic output of the electronic device 100. In response to the one or more accelerometers 180 determining that the electronic device 100 is tilted at an angle of greater than a pre-determined threshold, the electronic device 100 may be configured to prompt the user to find a flatter surface to place it on. Additionally and/or optionally, the electronic device 100 can be configured to alter the sound output to compensate for the tilted angle. In some embodiments, the one or more accelerometers 180 may also be configured to monitor for any resonant vibrations within the electronic device 100. The processor 102 may then be configured to adjust the audio output to help the subwoofer 112 and/or the audio driver assemblies 110 avoid and/or reduce the generation of frequencies that cause the electronic device 100 to vibrate at one or more resonant frequencies.

The various aspects, embodiments, implementations or features of the described embodiments can be used separately or in any combination. Various aspects of the described embodiments can be implemented by software, hardware or a combination of hardware and software. The described embodiments can also be embodied as computer-readable code on a computer-readable medium for controlling operation of the array speaker. In some embodiments, the computer-readable medium can include code for interacting with other connected devices within a user's home. For example, the array speaker could be configured to use its ambient light sensor to identify human activity and to learn when to activate and deactivate certain devices within the user's home. The computer-readable medium is any data storage device that can store data, which can thereafter be read by a computer system. Examples of the computer-readable medium include read-only memory, random-access memory, CD-ROMs, HDDs, DVDs, magnetic tape, and optical data storage devices. The computer-readable medium can also be distributed over network-coupled computer systems so that the computer-readable code is stored and executed in a distributed fashion.

Speaker Device

Figure 2:
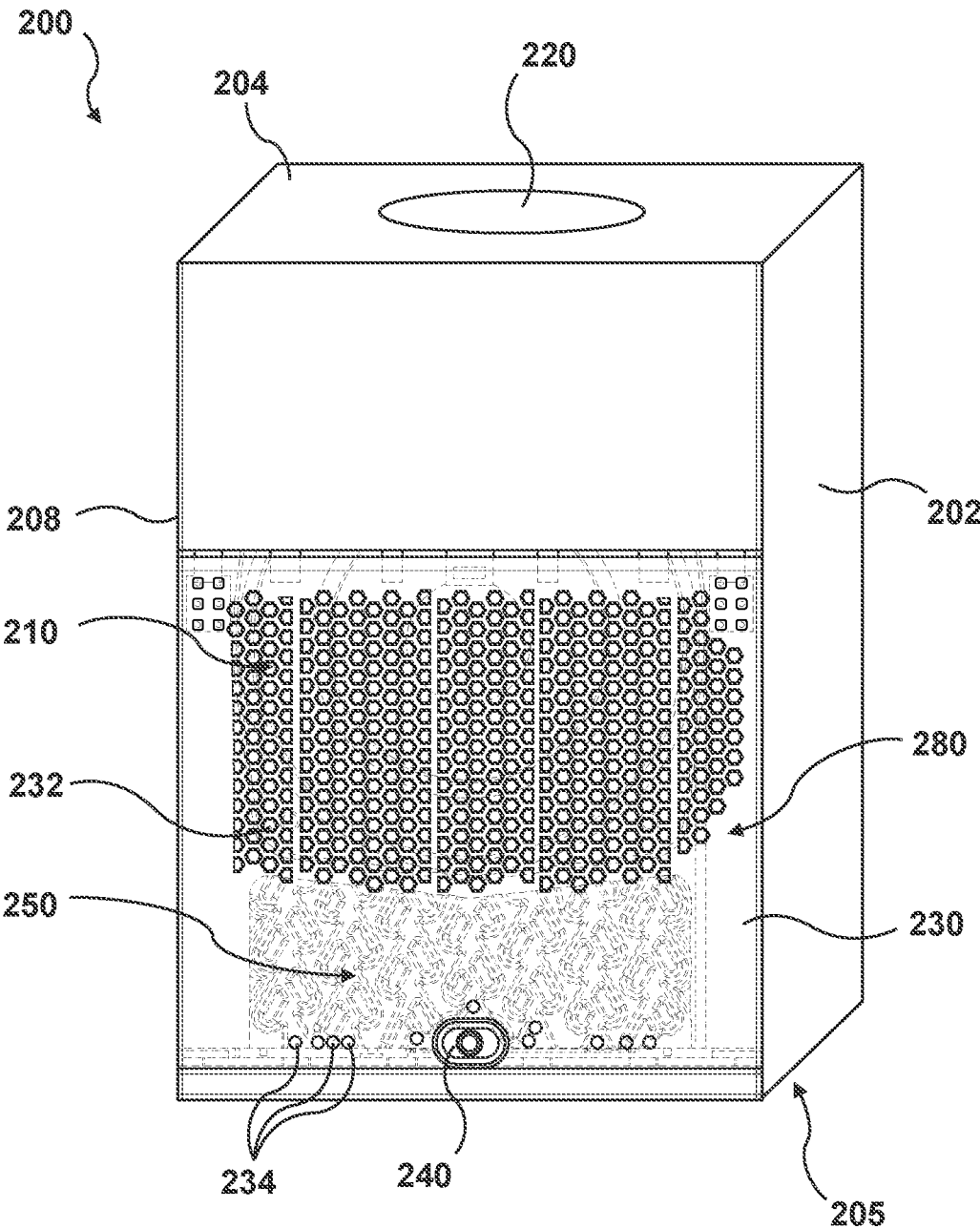
FIG. 2 depicts a schematic representation of a speaker device in accordance with some embodiments of the present technology.

With reference to FIG. 2, there is depicted a speaker device 200 in accordance with at least some embodiments of the present technology. The speaker device 200 comprises a body 202 for housing the electronic device 100. The body 202 has a top surface 204, a bottom surface 206, and walls 208. In some embodiments, it is contemplated that the body may have a single continues wall, for example, instead of the four walls 208. More or fewer than four walls are also contemplated in other embodiments of the present technology. The body 202 can be positioned by an operator on a support surface, such as a table (not depicted), for example.

It should be noted that a wall may be embodied as one or more rigid covers. For example, one of the walls 208 is provided in a form of a rigid cover 230. As it will be described in greater details below, the rigid cover includes at least two different types of apertures, first apertures 232 and second apertures 234. For sake of clarity, the speaker device 200 is illustrated in FIG. 2 with a semi-transparent representation of the rigid cover 230, and without a soft cover. In some embodiments, the soft cover may be made out of a fabric-like material used to cover the walls 208.

The body 202 has a top assembly 220 on the top surface 204. The top assembly 220 can be configured to receive and transmit indications of haptic interactions of the operator, capture and transmit indications of audio inputs and provide visual indications to the operator.

The body 202 has charging port 240 at the bottom of one of the walls 208. The charging port allows connecting the speaker device 200 to an electrical power source and with other electronic devices (not depicted) using a wired connection. It is contemplated that the speaker device 200 may have additional ports without departing from the scope of the present technology.

The body 202 has a frame 280 or a chassis supporting the top surface 204, the bottom surface 206, and the walls 280. The frame 280 is also configured to accommodate a subwoofer 210. The subwoofer 210 may be implemented similarly to the subwoofer 112 of the electronic device 100 without departing from the scope of the present technology.

The subwoofer 210 is configured to reproduce audio outputs by the speaker device 200. Generally speaking, a given audio output is a combination of acoustic waves, or "sound waves", having various audio frequencies. The subwoofer 210 is a low-frequency speaker designed to generate acoustic waves of generally low audio frequencies of the given audio output. The subwoofer 210 may be, for example and without limitations, a moving-iron speaker, a piezoelectric speaker, a magnetostatic speaker, a magnetostrictive speaker, an electrostatic speaker, a ribbon speaker, a bending wave speaker, or any other type of speaker. It is contemplated that other audio output systems are contemplated such as tweeters or treble speakers, for example, that are designed to generate sound waves of generally high audio frequencies of the given audio output. In another example, the speaker device 200 may also comprise beepers for reproducing audible indications of at least some operations of the speaker device 200 such as, but not limited to: turn on/off operations, standby mode on/off operations, mute operations and the like.

A heat removal component 250 is removably attached to the frame 280. In some embodiments of the present technology, the heat removal component 250 is configured to passively cooperate with the subwoofer 210 for removing heat from the speaker device 200. How the heat removal component 250 is configured to passively cooperate with the speaker device 200 will be described in greater details herein further below with reference to FIGS. 4 and 6.

Figure 3:
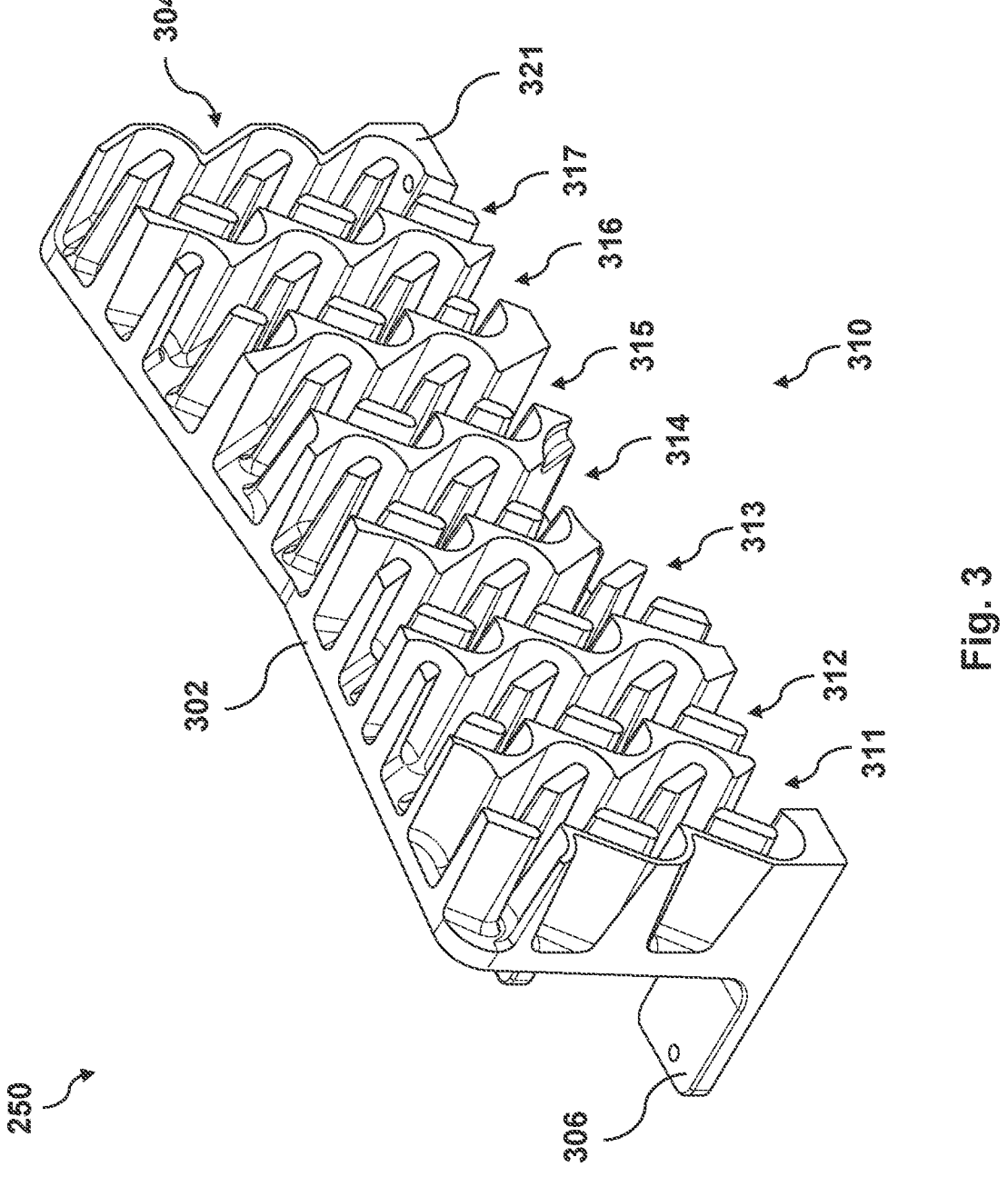
FIG. 3 is a perspective view of a passive heat removal component for cooling the electronic component of FIG. 1 in accordance with some embodiments of the present technology.
Figure 4:
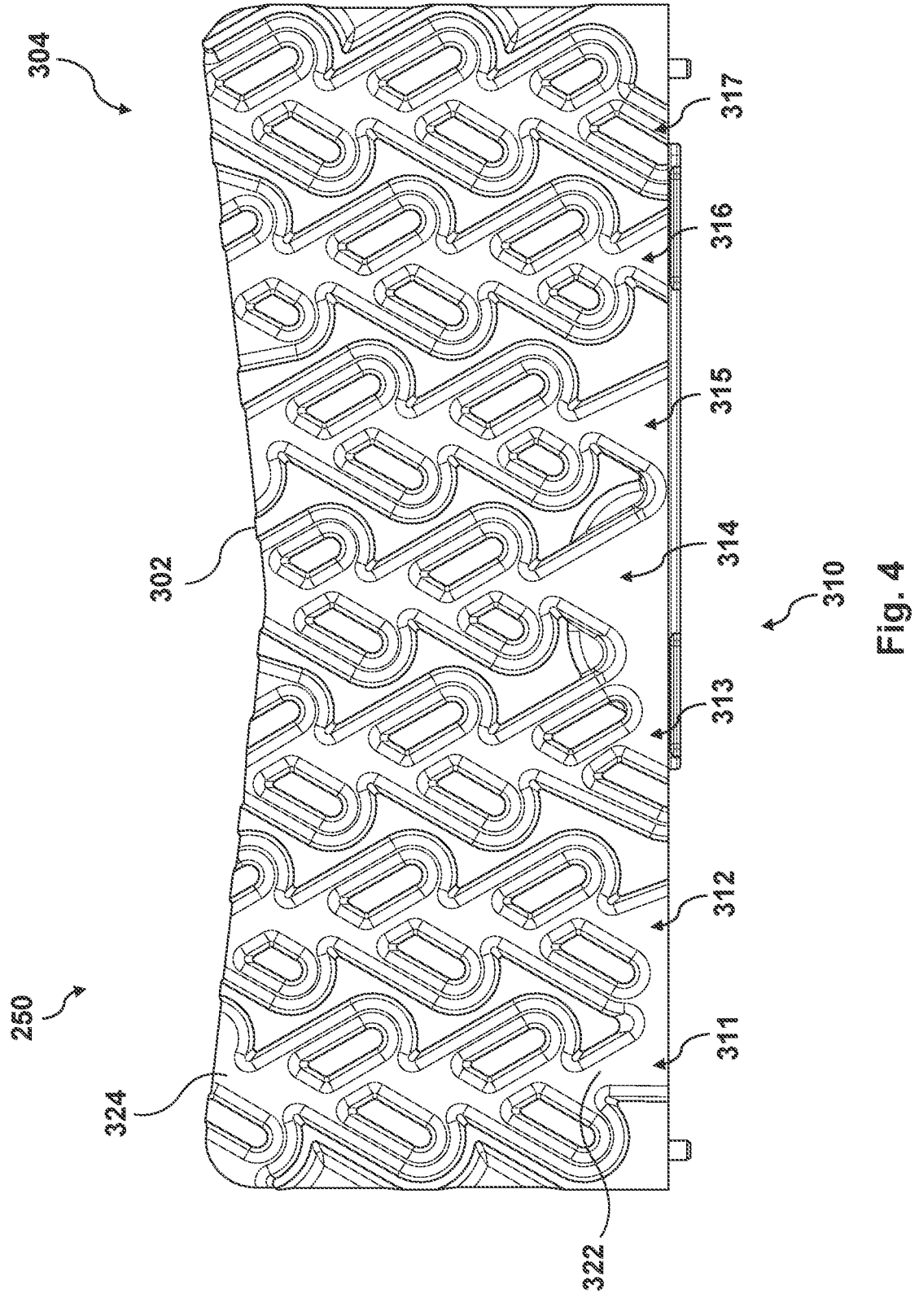
FIG. 4 is a front elevation view of the passive heat removal component of FIG. 3.

With reference to FIGS. 3 and 4, there is depicted the heat removal component 250, without the rest of the speaker device 200, as contemplated in at least some embodiments of the present technology. The heat removal component 250 has a body 302. The body 302 has an attachment portion 306, and a main portion 304. The attachment portion 306 is configured to be removably attached to a frame of a given speaker device. The attachment portion 306 is configured to attach the heat removal component 250 in proximity to an electronic component and to position the heat removal component 350 in proximity with (e.g. above) the electronic component for removing heat generated by the electronic component.

In this embodiment, the main portion 304 extends vertically from the attachment portion 306 and defines a plurality of valvular conduits 310 extending in parallel with one another. For example, the plurality of valvular conduits 310 comprises a first conduit 311, a second conduit 312, a third conduit 313, a fourth conduit 314, a fifth conduit 315, a sixth conduit 316, and a seventh conduit 317. The main portion 304 may define a different number of valvular conduits 310 in alternative embodiments, this aspect is not limitative.

In the illustrated embodiment, the plurality of valvular conduits 310 defined in the main portion 304 are tesla valves. A "tesla valve" is described in U.S. Pat. No. 1,329,559 entitled "Valvular Conduit", granted on Feb. 3, 1920, to Nikola Tesla, the contents of which is incorporated herein by reference in its entirety. In other embodiments however, one or more valvular conduits may include at least one of an enlargement, a recess, a projection, a baffle, and a bucket for reducing resistance to the airflow in a pre-determined direction and/or increasing resistance to the airflow in a direction opposite to the pre-determined direction.

It should be noted that all the valvular conduits 310 may not have a same common shape. For example and without limitation, the first valvular conduit 311 may have a different length, a different number of recesses and/or a different number of enlargements than the second valvular conduit 312.

As best shown on FIGS. 3 and 4, each valvular conduit 310 has a first end 322 and a second end 324, and enables an airflow in the pre-determined direction through the body from the first end 322 to the second end 324. In this embodiment, the valvular conduits 310 are open on an external surface 321 of the body 302, as depicted on FIG. 3. In other words, the valvular conduits 310 are defined on the external surface 321 of the body 302. It can thus be said that any one of the valvular conduits 310 is a channel-like valvular conduit. In alternative embodiments, the valvular conduits 310 are closed on the external surface 321 of the body 302. In other words, the valvular conduits 310 are defined within the body 302. It can thus be said that any one of the valvular conduits 310 is a chamber-like valvular conduit.

As such, in this embodiment, due to the main portion 304 extending vertically, the pre-determined direction is defined upward, from a bottom portion of the heat removal component 250 to a top portion thereof. As depicted on FIG. 4, one or more valvular conduits 310 may share a same first end 322.

In use, at least a portion of the heat removal component 250 (e.g. an external bottom surface) is maintained in contact with electronic components to be cooled. As depicted on FIG. 5, the speaker device 200 include one or more electronic components 50 to be cooled. The one or more electronic components 50 may be mounted on a board (e,g, motherboard) disposed below the heat removal component 250, or adjacent to the heat removal component 250 as shown on FIG. 5. Broadly speaking, the one or more electronic components 50 may be anywhere in proximity to the heat removal component 250 such that the heat removal component 250 captures thermal energy of the one or more electronic components 50 in a suitable manner. The one or more electronic components 50 may include, for example and without limitation, the wireless communication system 114, the computer-readable medium 116, the memory component 118, the accelerometers 180 and the processor 102 of the electronic device 100.

In this embodiment, the heat removal component 250 is in contact with electronic components 50. It is to be understood that in this context, the heat removal component 250 is said to be "in contact" with the one or more electronic components 50 even in cases where a thermal paste is applied between the heat removal component 250 and the one or more electronic components 50, in a manner that is known in the art, to ensure adequate heat transfer between the one or more electronic components 50 and the heat removal component 250. More specifically, in this embodiment, the heat removal component 250 is thermally coupled to the one or more electronic components 50 to be cooled, and the airflow that is conveyed through the valvular conduits 310 absorbs the heat from the one or more electronic components 50. As the air flows out of the valvular conduits 310, the thermal energy absorbed thereby is carried away. The heat removal component 250 may be combined with a radiator (e.g. a heat sink) to increase a thermal energy collection efficiency. The heat removal component 250 may be made of a material selected from a heat-conducting material such as for example aluminum, zinc, and/or copper.

Figure 5:
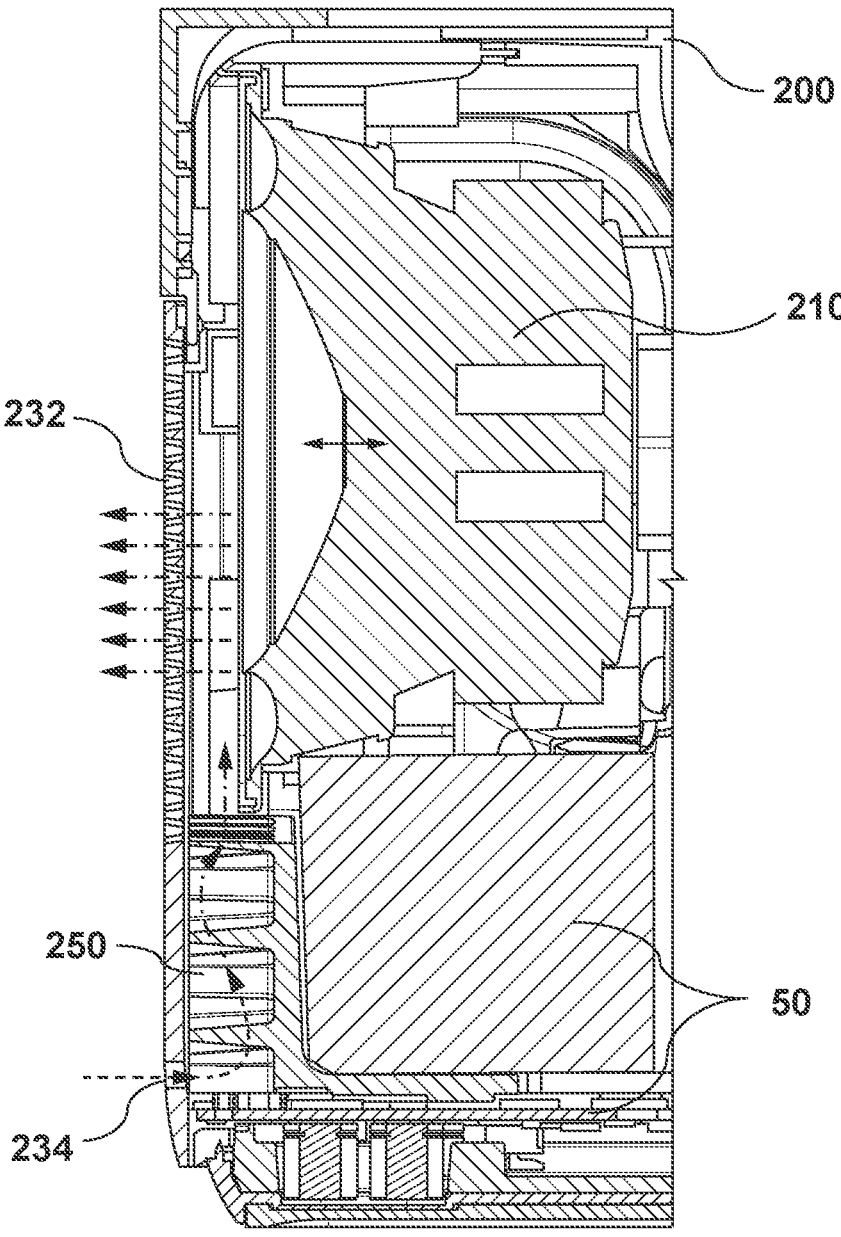
FIG. 5 is a cross-section view of the speaker device of FIG. 2.
Figure 6:
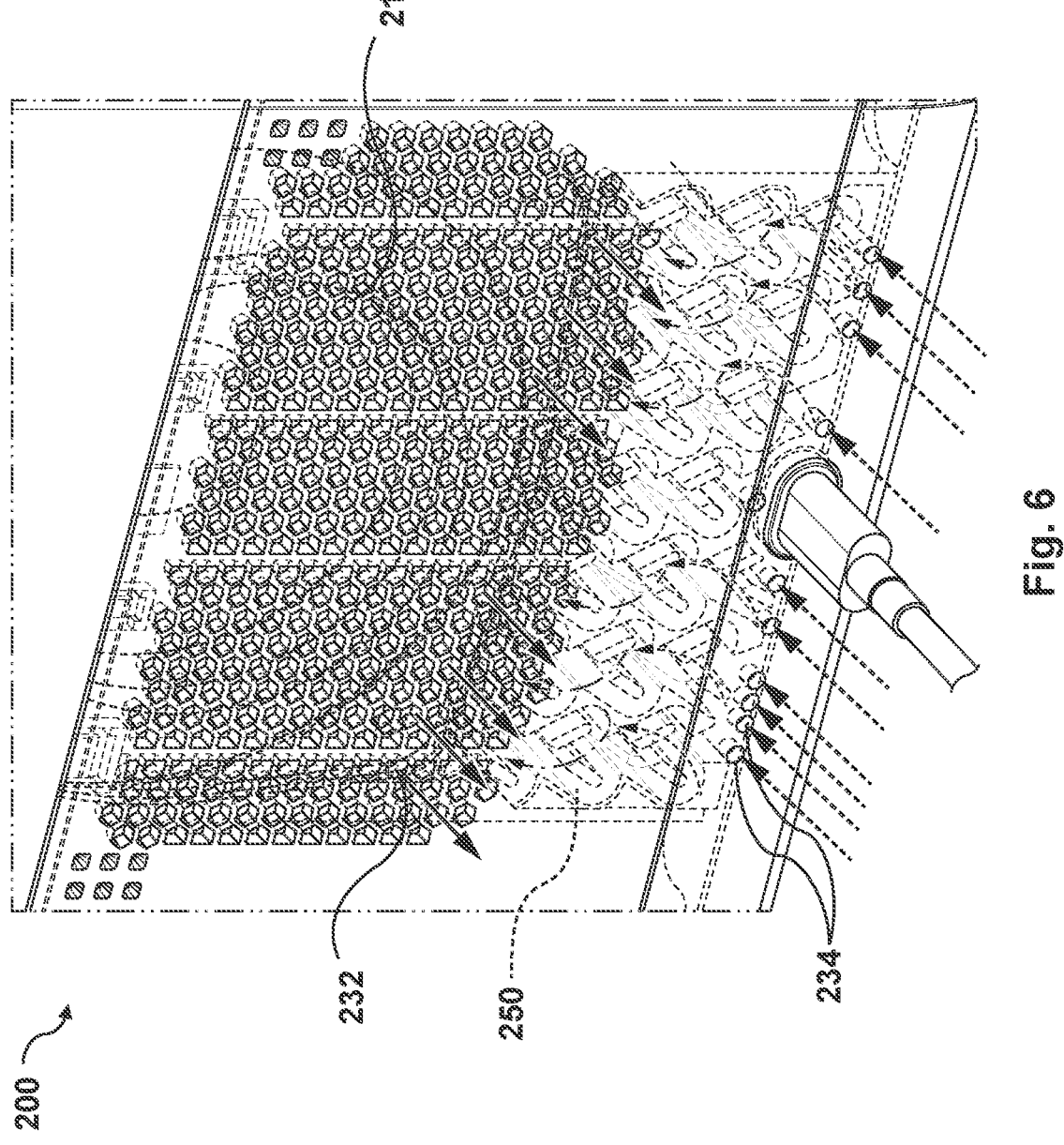
FIG. 6 is a schematic representation of an airflow flowing in the passive heat removal component in accordance with some embodiments of the present technology.

With reference to FIGS. 5 and 6, ambient air is guided by the first apertures 234 defined in a front wall 208 of the speaker device 200 to the first ends 322. The first ends 322 of the valvular conduits 310 are disposed proximate to the first apertures 234 to receive said ambient air. It should be noted that the ambient air may be pre-cooled prior entering in the valvular conduits 310, without departing from the scope of the present technology.

An airflow is thus further conducted in the valvular conduits 310 of the heat removal component 250 from the first ends 322 to the second ends 324. In this embodiment, geometrical characteristics of the valvular conduits 310 reduce resistance to the airflow in the pre-determined direction and/or increase resistance to the airflow in a direction opposite to the pre-determined direction. The airflow is thus directed from the first ends 322 to the second ends 324 (i.e. from a bottom portion of the heat removal component 250 to a top portion thereof) and collects thermal energy from the heat removal component 250, said thermal energy having been collected by the heat removal component 250 from the one or more electronic components 50.

In this embodiment, the subwoofer 210 generates, in use, acoustic waves to produce a desired audio signal (e.g. a music track). The second ends 324 of the valvular conduits 310 are disposed in proximity to the subwoofer 210 such that, upon exiting the valvular conduits 310, the heated airflow is carried away from the speaker device 200 by the acoustic waves. More specifically, during use of the speaker device 200, the heated airflow is directed towards the subwoofer 210 such that the generated acoustic waves move said heated airflow away from the speaker device 200 through the second apertures 324.

Generation of the acoustic waves stops when the speaker device 200 is not used, as well as the generation of thermal energy by the one or more electronic components 50. It can thus be said that cooling is provided in a passive manner by the heat removal component 250 during usage of the speaker device 200 and partly relies on the acoustic waves of the subwoofer 210. The heat removal component 250 may thus be referred as a "passive heat removal component". Indeed, in this embodiment, air from the environment is passively conveyed by the valvular conduits 310 of the heat removal component. Intake of air by a valvular conduit and exhaust of heated air by valvular conduit is performed in a passive manner. Cooling of the electronic component is thus passively provided by the heat removal component 250 during use of the speaker device 200 in collaboration with the subwoofer 210 that generates the acoustic waves used to carry the heated airflow away.

Developers of the present technology have realized that a passive cooling system for the speaker device 200 does not generate additional acoustic noise, as opposed to active cooling systems. Furthermore, it is noted that active cooling systems require additional room which may not be desirable for compact speaker devices. Indeed, the passive cooling system described herein may occupy less interior space in the body 202 of the speaker device 200.

Figure 7:
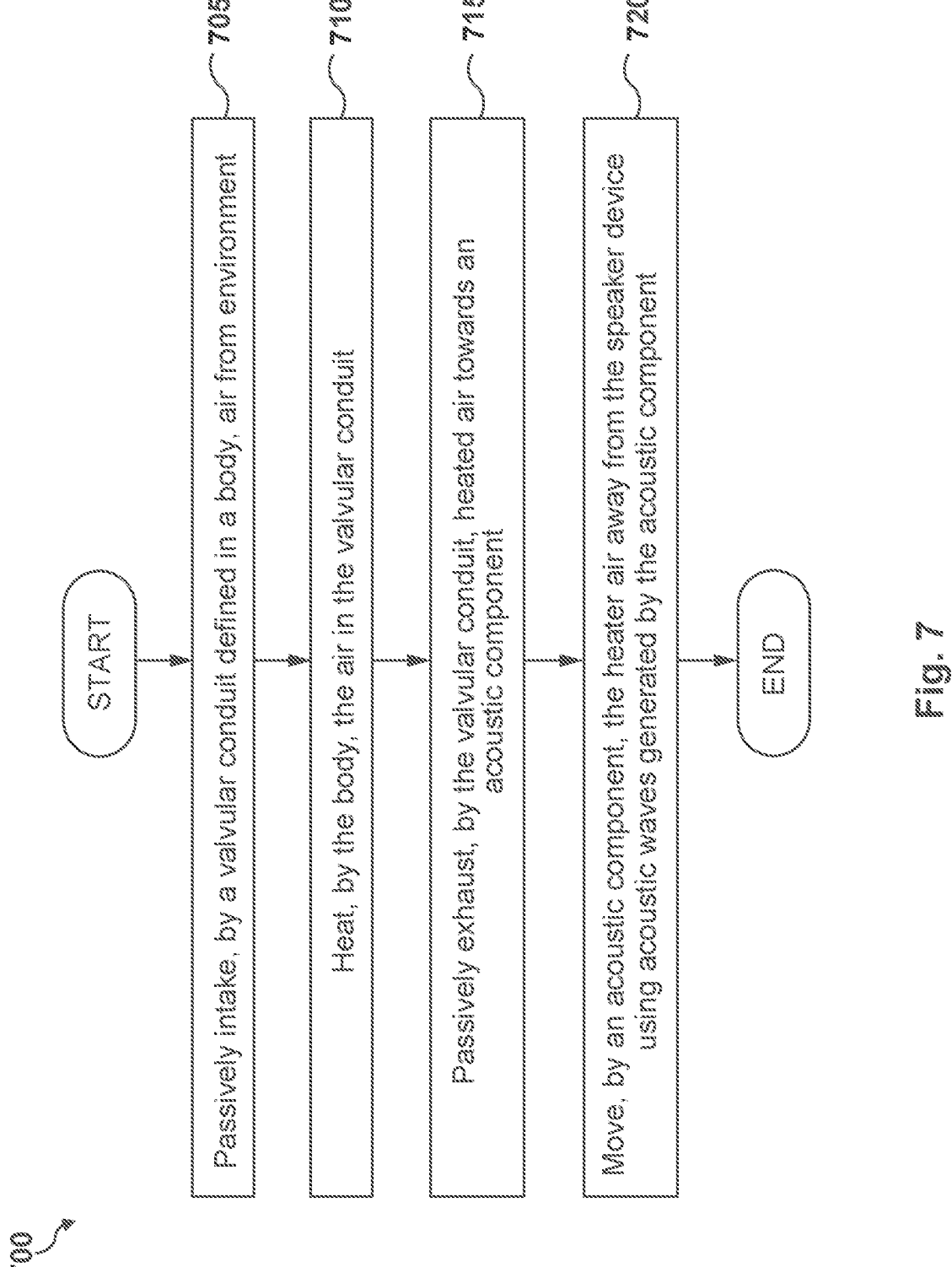
FIG. 7 shows a flowchart of a method performed in accordance with various implementations of the disclosed technology.

FIG. 7 is a flow diagram of a method 700 for cooling an electronic component of a speaker device, such as the speaker device 200, according to some embodiments of the present technology. In this embodiment, the speaker device includes the electronic component, an acoustic component, and a heat removal component, the heat removal component having a body removably attached to the speaker device. In this embodiment, the electronic component is implemented as the one or more electronic components 50, the acoustic component is implemented as the subwoofer 210 and the heat removal component is implemented as the heat removal component 250. The electronic components may include, for example and without limitation, a processor an/or a memory component. Some steps or portions of steps in the flow diagram may be omitted or changed in order.

Step 705: Passively Intaking, by a Valvular Conduit Defined in the Body, Air from Environment The method 700 includes passively intaking, at step 705, air from environment by a valvular conduit defined in the body of the heat removal component (e.g. the body 302). The valvular conduits may be implemented as any one of the valvular conduits 310. In this embodiment, the valvular conduit is configured to enable airflow in a pre-determined direction through the body.

In this embodiment, the valvular conduit vertically extends in the body such that the first end is located on a bottom portion of the body and the second end is located on a top portion of the body. For example and without limitation, the first end may be disposed in proximity to the electronic component to be cooled. The valvular conduit includes at least one of an enlargement, recess, projection, baffle, and a bucket or a combination thereof for reducing resistance to the airflow in the pre-determined direction and/or increasing resistance to the airflow in a direction opposite to the pre-determined direction. For example, the valvular conduit may be a tesla-valve conduit. As such, it can be said that the valvular conduit is a channel-like valvular conduit or a chamber-like valvular conduit.

In an embodiment, the speaker device includes external walls such as walls 208 defining one or more apertures. The method 700 may include guiding, by at least one aperture, the air from the environment towards the valvular conduit.

In an embodiment, the body defines a plurality of valvular conduits, the valvular conduit being one of the plurality of valvular conduits. In said embodiment, the valvular conduit extends parallel to another one from the plurality of valvular conduits in the body.

Step 710: Heating, by the Body, the Air in the Valvular Conduit

The method 700 further includes heating, at step 710, the air in the valvular conduit by the body. More specifically, thermal energy generated by the electronic component is collected by the heat removal component. In an embodiment, the heat removal component is in contact with the electronic component, or at least proximate enough to enable suitable thermal energy transfer between the electronic component and the heat removal component. Thermal energy is further collected by the airflow conducted in the valvular conduits. As the air flows out of the valvular conduits, so does the thermal energy collected thereby, thus providing cooling to the electronic component. In an embodiment, the heat removal component is made of a material selected from a heat-conducting material such as for example aluminum, zinc, and/or copper to ease thermal energy transfer from the electronic device to the airflow.

The method 700 may include maintaining at least a portion of the body in thermal contact with the electronic component to ensure efficient thermal energy transfer from the electronic component to the heat removal component. The collected thermal energy is then further transferred to the airflow passing in the valvular conduit, thereby heating the air therein. Thermal energy is thus carried away by the airflow.

Step 715: Passively Exhausting, by the Valvular Conduit, Heated Air Towards the Acoustic Component The method 700 further includes passively exhausting, at step 715, heated air towards the acoustic component. More specifically, the airflow exits the valvular conduit at the second end thereof (e.g. second end 324). In an embodiment, the second end is located above the first end, such that heated airflow rises in the valvular conduit in the pre-determined direction thereof.

Step 720: Moving, by the Acoustic Component, the Heated Air Away from the Speaker Device Using Acoustic Waves Generated by the Acoustic Component The method 700 further includes moving, at step 720, the heated air away from the speaker device by the acoustic component using acoustic waves generated thereby. In an embodiment, the second end of the valvular conduit is disposed in proximity to the acoustic component in order for the acoustic waves to efficiently carry the heated airflow away from the speaker device. More specifically, the second end may be located relative to the acoustic component such that the heated airflow exiting the second end propagates in a propagating field of the acoustic wave. The acoustic wave thus carries the heated airflow away from the speaker device.

While the above-described implementations have been described and shown with reference to particular steps performed in a particular order, it will be understood that these steps may be combined, sub-divided, or re-ordered without departing from the teachings of the present technology. At least some of the steps may be executed in parallel or in series. Accordingly, the order and grouping of the steps is not a limitation of the present technology.

The invention claimed is:

1. A passive heat removal component for a speaker device, the passive heat removal component comprising:
a body configured to be removably attached to the speaker device,
the body defining a plurality of valvular conduits, a valvular conduit from the plurality of valvular conduits having a first end and a second end, the valvular conduit allowing an airflow in a pre-determined direction through the body from the first end to the second end, an other one from the plurality of valvular conduits extending parallel to the valvular conduit in the body, the other one from the plurality of valvular conduits having an other first end and an other second end, the other one from the plurality of valvular conduits allowing an other airflow in an other pre-determined direction through the body from the other first end to the other second end; and
the body being disposed in proximity to an electronic component of the speaker device for transferring thermal energy from the electronic component to the airflow in the valvular conduit, the body further being disposed for transferring thermal energy from the electronic component to the other airflow in the other one from the plurality of valvular conduits, the other second end of the other one from the plurality of valvular conduits being disposed in proximity to an acoustic component of the speaker device such that other heated airflow exhausted from the other one from the plurality of valvular conduits is directed toward the acoustic component, and such that operation of the acoustic component is configured to cause movement of the other heated airflow away from the speaker device by acoustic waves generated by the acoustic component.

2. The passive heat removal component of claim 1, wherein the second end of the valvular conduit is disposed in proximity to the acoustic component of the speaker device, such that operation of the acoustic component is configured to cause movement of heated airflow away from the speaker device by the acoustic waves.

3. The passive heat removal component of claim 1, wherein the valvular conduit extends vertically in the body such that the first end is located at a bottom portion of the body and the second end is located at a top portion of the body.

4. The passive heat removal component of claim 1, wherein the valvular conduit is a channel-like valvular conduit defined on a surface of the body.

5. The passive heat removal component of claim 1, wherein the valvular conduit is a chamber-like valvular conduit defined in the body.

6. The passive heat removal component of claim 1, wherein the valvular conduit includes at least one of an enlargement, a recess, a projection, a baffle, or a bucket for at least one of (i) reducing resistance to the airflow in the pre-determined direction or (ii) increasing resistance to the airflow in a direction opposite to the pre-determined direction.

7. The passive heat removal component of claim 1, wherein the first end is disposed in proximity to the electronic component.

8. The passive heat removal component of claim 1, wherein at least a portion of the body is maintained in thermal contact with the electronic component.

9. The passive heat removal component of claim 1, wherein the acoustic component is a speaker.

10. The passive heat removal component of claim 1, wherein the electronic component is located on a motherboard.

11. The passive heat removal component of claim 1, wherein the electronic component comprises at least one of a processor, and a memory component.

12. The passive heat removal component of claim 1, wherein the body is made of a material selected from a group of material, said group comprising aluminum, zinc, and copper.

13. A method of cooling an electronic component of a speaker device, the speaker device comprising the electronic component, an acoustic component, and a heat removal component, the heat removal component having a body removably attached to the speaker device, the method comprising:
passively intaking, by a valvular conduit defined in the body, air from environment, the valvular conduit allowing an airflow in a pre-determined direction through the body;
heating, by the body, the air in the valvular conduit;
passively exhausting, by the valvular conduit, heated air towards the acoustic component;
moving, by the acoustic component, the heated air away from the speaker device using acoustic waves generated by the acoustic component;
passively intaking, by an other valvular conduit defined in the body, other air from the environment, the other valvular conduit allowing an other airflow in an other pre-determined direction;
heating, by the body, the other air in the other valvular conduit;
passively exhausting, by the other valvular conduit, other heated air towards the acoustic component; and
moving, by the acoustic component, the other heated air away from the speaker device using the acoustic waves.

14. The method of claim 13, wherein the speaker device has a wall with an aperture, the method comprising:
guiding, by the aperture, the air from the environment towards the valvular conduit.

15. A speaker device comprising:

an acoustic component generating acoustic waves;

an electronic component generating thermal energy; and a passive heat removal component including a body removably attached to the speaker device, the body defining a plurality of valvular conduits, a valvular conduit from the plurality of valvular conduits having a first end and a second end, the valvular conduit allowing an airflow in a pre-determined direction through the body from the first end to the second end, an other one from the plurality of valvular conduits extending parallel to the valvular conduit in the body, the other one from the plurality of valvular conduits having an other first end and an other second end, the other one from the plurality of valvular conduits allowing an other airflow in an other pre-determined direction through the body from the other first end to the other second end; and the body being disposed in proximity to the electronic component for transferring thermal energy from the electronic component to the airflow in the valvular conduit, the body further being disposed for transferring thermal energy from the electronic component to the other airflow in the other one from the plurality of valvular conduits, the other second end of the other one from the plurality of valvular conduits being disposed in proximity to an acoustic component of the speaker device such that other heated airflow exhausted from the other one from the plurality of valvular conduits is directed toward the acoustic component, and such that operation of the acoustic component is configured to cause movement of the other heated airflow away from the speaker device by acoustic waves generated by the acoustic component.

16. The speaker device of claim 15, wherein the second end of the valvular conduit is disposed in proximity to the acoustic component, such that operation of the acoustic component is configured to cause movement of heated airflow away from the speaker device by the acoustic waves.

17. The speaker device of claim 15, wherein the valvular conduit includes at least one of an enlargement, recess, projection, baffle, or a bucket or a combination thereof for at least one of (i) reducing resistance to the airflow in the pre-determined direction or (ii) increasing resistance to the airflow in a direction opposite to the pre-determined direction.

\* \* \* \* \*